United States Patent
Shiota

(10) Patent No.: US 7,565,589 B2
(45) Date of Patent: Jul. 21, 2009

(54) SEMICONDUCTOR INTEGRATED CIRCUIT HAVING A BIST CIRCUIT

(75) Inventor: Ryoji Shiota, Kanagawa (JP)

(73) Assignee: Panasonic Corporation, Osaka (JP)

( * ) Notice: Subject to any disclaimer, the term of this patent is extended or adjusted under 35 U.S.C. 154(b) by 255 days.

(21) Appl. No.: 11/717,092

(22) Filed: Mar. 13, 2007

(65) Prior Publication Data
US 2007/0250747 A1    Oct. 25, 2007

(30) Foreign Application Priority Data
Apr. 20, 2006 (JP) .............................. 2006-116792

(51) Int. Cl.
*G01R 31/28* (2006.01)
(52) U.S. Cl. ...................... 714/724; 714/733
(58) Field of Classification Search ................. 714/724, 714/733
See application file for complete search history.

(56) References Cited

U.S. PATENT DOCUMENTS

| | | | |
|---|---|---|---|
| 5,661,729 A | 8/1997 | Miyazaki et al. | |
| 6,175,529 B1 | 1/2001 | Otsuka et al. | |
| 6,574,762 B1 * | 6/2003 | Karimi et al. | ................ 714/727 |
| 7,444,564 B2 * | 10/2008 | Anand et al. | ................. 714/723 |
| 2003/0014704 A1 | 1/2003 | Nishimura | |
| 2007/0113131 A1 * | 5/2007 | Takeoka et al. | ............. 714/726 |

FOREIGN PATENT DOCUMENTS

| | | |
|---|---|---|
| JP | 4-10040 | 1/1992 |
| JP | 8-329698 | 12/1996 |
| JP | 11-260096 | 9/1999 |
| JP | 2000-88926 | 3/2000 |
| JP | 2003-31666 | 1/2003 |

* cited by examiner

*Primary Examiner*—James C Kerveros
(74) *Attorney, Agent, or Firm*—McDermott Will & Emery LLP

(57) ABSTRACT

A semiconductor integrated circuit, includes a first external terminal which inputs a test signal, a second external terminal which external inputs a clock signal, a self-test circuit which conducts a self-test based on the clock signal which is input through the second external terminal, a third external terminal which outputs, to the outside, a test judgment signal which is output from the self-test circuit, an external output control circuit which controls output of the test judgment signal from the third external terminal on the basis of the test signal which is input through the first external terminal and a test completion signal which is output from the self-test circuit, and a clock signal input control circuit which controls input, to the self-test circuit, of the clock signal which is input through the second external terminal, on the basis of the test judgment signal and the test completion signal.

6 Claims, 3 Drawing Sheets

PRIOR ART *FIG. 3*
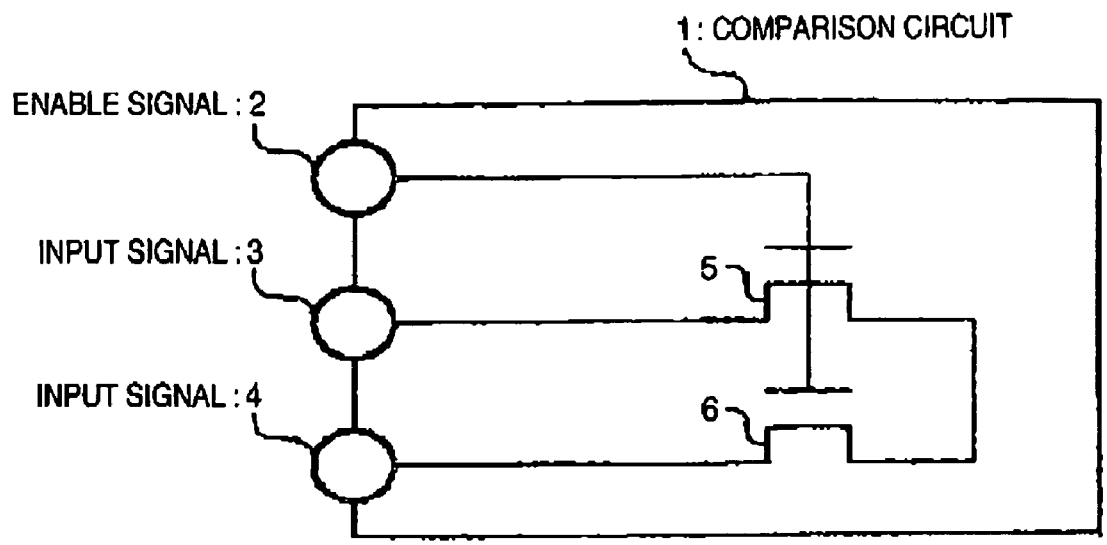
PRIOR ART *FIG. 4*
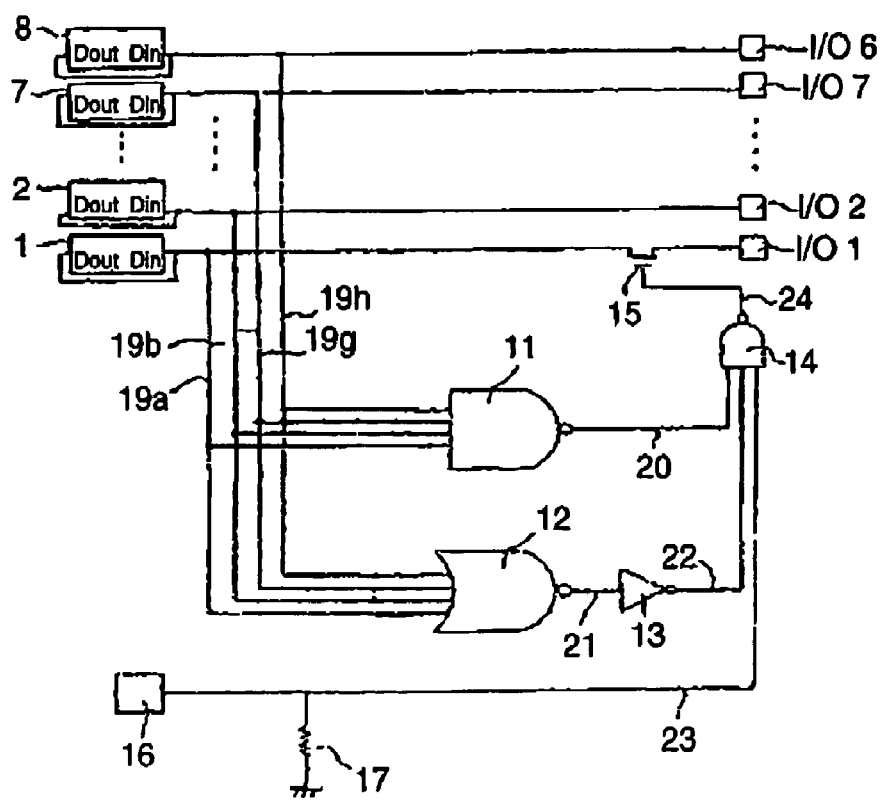

SEMICONDUCTOR INTEGRATED CIRCUIT HAVING A BIST CIRCUIT

BACKGROUND OF THE INVENTION

The present invention relates to a semiconductor integrated circuit having a self-test circuit.

Semiconductor integrated circuits (LSIs) are known which have a BIST (built-in self-test) circuit for conducting a self-test. Upon a start of a test, the BIST circuit generates test patterns and supplies those to a test subject circuit such as a memory circuit or a logic circuit. The BIST circuit judges whether the test subject circuit is defective or not by comparing data indicating test results of the test subject circuit with expected values.

As shown in FIG. 3, a test circuit disclosed in Patent document 1 includes transistors 5 and 6 whose one terminals are connected to each other. An enable signal 2 is input to the gates of the transistors 5 and 6, and input signals 3 and 4 are input to the other terminals of the transistors 3 and 4, respectively. The transistors 5 and 6 are turned on when the enable signal 2 becomes active. The input signals 3 and 4 are compared with each other in this state. Since the transistors 5 and 6 are wire-connected to each other, no current flows through the transistors 5 and 6 as long as the potentials of the input signals 3 and 4 are the same. But an abnormal current flows if the potentials of the input signals 3 and 4 are different from each other. The test circuit makes a failure/non-failure judgment on the basis of the value of the abnormal current.

As shown in FIG. 4, a memory module test circuit disclosed in Patent document 2 includes NAND gates 11 and 14, a NOR gate 12, a NOT gate 13, and a transistor 15. Each memory module has I/O ports (input/output terminals) for communization of a data input and a data output. A test result is also output from an I/O port by switching operation of the transistor 15. The communization of the terminals reduces the number of terminals.

[Patent document 1] JP-A-2000-088926

[Patent document 2] JP-A-4-010040

In the test circuit of Patent document 1, since the output terminals of the transistors 5 and 6 are short-circuited with each other, the transistors 5 and 6 may be broken by a flow-through current. Such breaking causes no problem because the test subject circuit is originally in failure. However, the above test circuit cannot be applied to a case that a memory that once produced a test result "NG" is tested again after being subjected to redundancy remedy to increase the yield. Furthermore, with the above test circuit, a failure analysis cannot be performed easily because a failure/non-failure judgment is made on the basis of an abnormal current flowing through the transistors 5 and 6.

In the test circuit of Patent document 2, since plural memory modules are bundled by means of the logic gates, the number of logic gates increases as the number of memory modules increases.

SUMMARY OF THE INVENTION

An object of the present invention is to provide a semiconductor integrated circuit which has a self-test circuit and is small in the number of external terminals for a test.

The invention provides a semiconductor integrated circuit, comprising:

a first external terminal which inputs a test signal;

a second external terminal which external inputs a clock signal;

a self-test circuit which conducts a self-test based on the clock signal which is input through the second external terminal;

a third external terminal which outputs, to the outside, a test judgment signal which is output from the self-test circuit;

an external output control circuit which controls output of the test judgment signal from the third external terminal on the basis of the test signal which is input through the first external terminal and a test completion signal which is output from the self-test circuit; and a clock signal input control circuit which controls input, to the self-test circuit, of the clock signal which is input through the second external terminal, on the basis of the test judgment signal and the test completion signal.

According to the above configuration, it is not necessary to provide this semiconductor integrated circuit with an external terminal for output of the test completion signal or an external terminal for output of the test judgment signal. Therefore, the number of external terminals that are necessary for a self-test by the self-test circuit can be reduced.

In the above semiconductor integrated circuit, preferably, the external output control circuit includes an external terminal control circuit which outputs an enable signal in accordance with the test signal and the test completion signal, and a tri-state buffer which controls output, from the third external terminal, of the test judgment signal in accordance with a state of the enable signal which is output from the external terminal control circuit.

In the above semiconductor integrated circuit, the tri-state buffer is rendered in a high-impedance state when the enable signal is in an inactive state.

In the above semiconductor integrated circuit, the tri-state buffer allows the test judgment signal to be output from the third external terminal to the outside when the enable signal is in an active state.

In the above semiconductor integrated circuit, the clock signal input control circuit inputs the clock signal to the self-test circuit when both of the test judgment signal and the test completion signal are normal. Therefore, whether the signals that are output from the self-test circuit are abnormal can be judged on the basis of whether or not the clock signal input control circuit outputs the clock signal. As a result, a failure in the semiconductor integrated circuit can be identified easily.

In the above semiconductor integrated circuit, the clock signal input control circuit includes a control signal output circuit which outputs a control signal in accordance with the test judgment signal and the test completion signal, and a PLL circuit which outputs a frequency-divided clock signal which is generated by frequency-dividing the clock signal which is input through the second external terminal, when receiving the control signal from the control signal output circuit. The frequency-divided clock signal which is output from PLL circuit is input to the self-test circuit. This semiconductor integrated circuit can generate test patterns easily because a self-test is not started until stable oscillation of the PLL circuit.

The semiconductor integrated circuit according to the invention can reduce the number of external terminals that are necessary for a self-test by the self-test circuit.

BRIEF DESCRIPTION OF THE DRAWINGS

The above objects and advantages of the present invention will become more apparent by describing in detail preferred exemplary embodiments thereof with reference to the accompanying drawings, wherein:

FIG. 3 is a block diagram showing the configuration of a test circuit disclosed in JP-A-2000-088926; and FIG. 4 is an explanatory diagram of a memory module test circuit disclosed in JP-A4-010040.

DETAILED DESCRIPTION OF THE PREFERRED EMBODIMENTS

Next, embodiments of the present invention will be described with reference to the drawings.

First Embodiment

Figure 1:
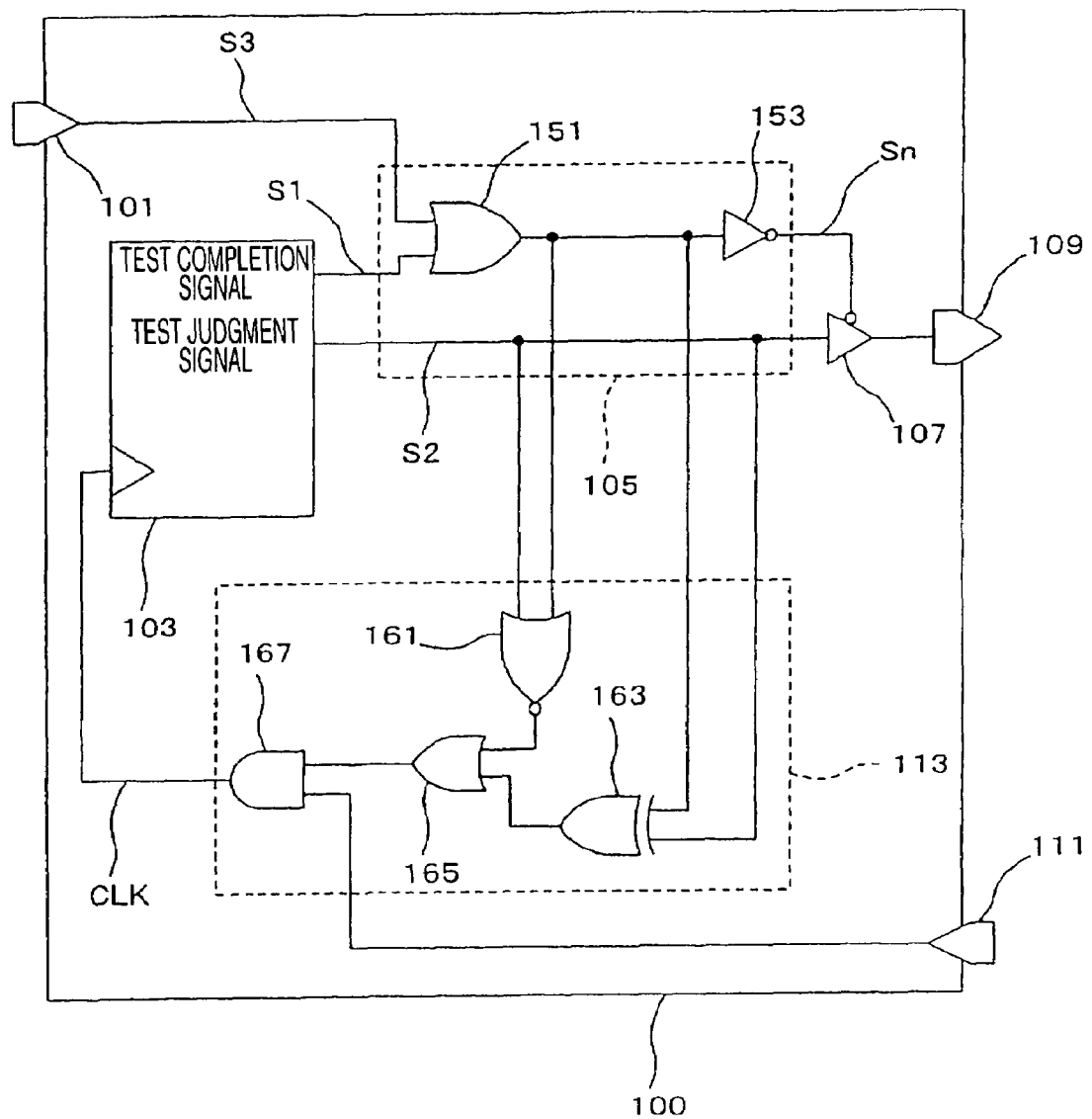
FIG. 1 is a circuit diagram of a semiconductor integrated circuit having a BIST circuit according to a first embodiment of the present invention.

FIG. 1 is a circuit diagram of a semiconductor integrated circuit having a BIST circuit according to a first embodiment of the present invention. As shown in FIG. 1, a semiconductor integrated circuit 100 according to the first embodiment includes a test signal input terminal 101, a BIST (built-in self-test) circuit 103, an external terminal control circuit 105, a tri-state buffer 107, a test result output terminal 109, a clock signal input terminal 111, and a clock control circuit 113. The semiconductor integrated circuit 100 may include a memory (not shown).

The test signal input terminal 101 is an external terminal for input of a test signal. When a clock signal is input to the BIST circuit 103 from the clock control circuit 113, the BIST circuit 103 conducts a self-test and outputs a test completion signal S2 and a test judgment signal S2.

The external terminal control circuit 105 outputs an enable signal Sn to the tri-state buffer 107 on the basis of the states of a test signal S3 that is input via the test signal input terminal 101 and the test completion signal S1 that is output from the BIST circuit 103. The external terminal control circuit 105 has an OR gate 151 and a NOT gate 153. The test signal S3 and the test completion signal S1 are input to the OR gate 151. An output signal of the OR gate 151 is input to the NOT gate 153. The enable signal Sn is an output signal of the NOT gate 153.

The tri-state buffer 107 controls the output, to the test result output terminal 109, of the test judgment signal S2 that is input from the BIST circuit 103, in accordance with the state of the enable signal Sn that is output from the external terminal control circuit 105. For example, if the enable signal Sn is in an inactive state, the tri-state buffer 107 is rendered in a high-impedance (Hi-Z) state and hence the test judgment signal S2 is not output to the test result output terminal 109. On the other hand, if the enable signal Sn is in an active state, the tri-state buffer 107 outputs the test judgment signal S2 to the test result output terminal 109.

The test result output terminal 109 is an external terminal for output of the test judgment signal S2 that is output from the tri-state buffer 107. The clock signal input terminal 111 is an external terminal for input of a clock signal.

The clock control circuit 113 outputs a clock signal CLK to the BIST circuit 103 in accordance with the states of the clock signal that is input via the clock signal input terminal 111 and the test completion signal S1 and the test judgment signal S2 that are output from the BIST circuit 103. The clock control circuit 113 has a NOR gate 161, an XOR gate 163, an OR gate 165, and an AND gate 167. An output signal of the OR gate 151 of the external terminal control circuit 105 and the test judgment signal S2 are input to the NOR gate 161. The output signal of the OR gate 151 of the external terminal control circuit 105 and the test judgment signal S2 are also input to the XOR gate 163. Output signals of the NOR gate 161 and the XOR gate 163 are input to the OR gate 165. An output signal of the OR gate 165 and the clock signal that is input via the clock signal input terminal 111 are input to the AND gate 167. Therefore, the clock control circuit 113 outputs the clock signal CLK only when the output of the OR gate 165 is "H (1)". The clock signal CLK that is output from the clock control circuit 113 is input to the BIST circuit 103.

As described above, in the semiconductor integrated circuit 100 according to the embodiment, the number of external terminals that are necessary for a self-test by the BIST circuit 103 is three (i.e., the test signal input terminal 101, test result output terminal 109, and clock signal input terminal 111) irrespective of the scale of the semiconductor integrated circuit 100 or the number of modules in the semiconductor integrated circuit 100. The semiconductor integrated circuit 100 need not be equipped with an external terminal for output of the test completion signal or an external terminal for output of the test judgment signal, which is the reason why the number of external terminals that are necessary for a self-test can be reduced.

With the above-described configuration of the clock control circuit 113, the output of the OR gate 165 of the clock control circuit 113 becomes "L (0)" if at least one of the test completion signal S1 and the test judgment signal S2 that are output from the BIST circuit 103 is abnormal. If the output of the OR gate 165 of the clock control circuit 113 is "L (0)," the clock control circuit 113 does not output the clock signal CLK. Therefore, whether the signals S1 and S2 that are output from the BIST circuit 103 are abnormal can be judged on the basis of whether or not the clock control circuit 113 outputs the clock signal CLK. As a result, a failure in the semiconductor integrated circuit 100 can be identified easily.

Second Embodiment

Figure 2:
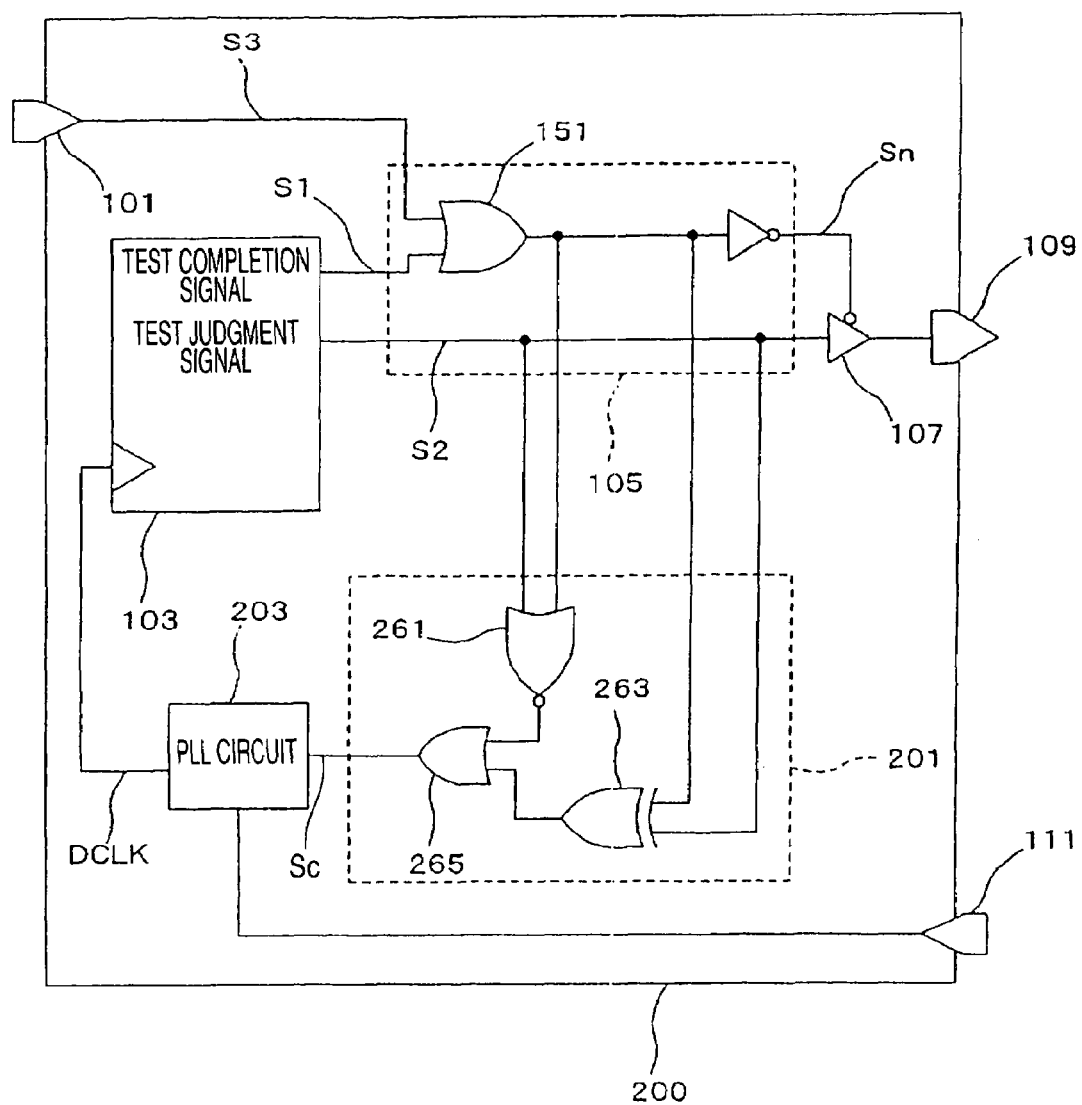
FIG. 2 is a circuit diagram of a semiconductor integrated circuit having a BIST circuit according to a second embodiment of the invention.

FIG. 2 is a circuit diagram of a semiconductor integrated circuit having a BIST circuit according to a second embodiment of the invention. As shown in FIG. 2, the semiconductor integrated circuit 200 according to the second embodiment includes a PLL circuit 203 and a clock control circuit 201 which is different in configuration from the clock control circuit 113 of the semiconductor integrated circuit 100 according to the first embodiment. The second embodiment is the same as the first embodiment except for these points. Components in FIG. 2 having the same components in FIG. 1 are given the same reference symbols as the latter.

The clock control circuit 201 of the second embodiment outputs a control signal Sc in accordance with the states of the test completion signal S1 and the test judgment signal S2 that are output from the BIST circuit 103. The clock control circuit 201 has a NOR gate 261, an XOR gate 263, and an OR gate 265. An output signal of the OR gate 151 of the external terminal control circuit 105 and the test judgment signal S2 are input to the NOR gate 261. The output signal of the OR gate 151 of the external terminal control circuit 105 and the test judgment signal S2 are also input to the XOR gate 263. Output signals of the NOR gate 261 and the XOR gate 263 are input to the OR gate 265. The control signal Sc that is output from the clock control circuit 201 is an output signal of the OR gate 265, and is input to the PLL circuit 203.

The PLL circuit 203 operates in accordance with the state (H/L (1/0)) of the control signal Sc that is input from the clock control circuit 201. The clock signal that is input via the clock signal input terminal 111 is input to the PLL circuit 203 as a reference clock. Therefore, only when the control signal Sc is "H (1)," the PLL circuit 203 outputs a frequency-divided clock signal DCLK which is produced by frequency-dividing the reference clock. The frequency-divided clock signal DCLK that is output from the PLL circuit 203 is input to the BIST circuit 103.

As described above, in the semiconductor integrated circuit 200 according to the embodiment, the PLL circuit 203 does not output the frequency-divided clock signal DCLK if at least one of the test completion signal S1 and the test judgment signal S2 that are output from the BIST circuit 103 is abnormal. Therefore, whether the signals S1 and S2 that are output from the BIST circuit 103 are abnormal can be judged on the basis of whether or not the PLL circuit 203 outputs the frequency-divided clock signal DCLK. As a result, a failure in the semiconductor integrated circuit 200 can be identified easily.

A test process of the semiconductor integrated circuit 200 according to the embodiment mainly has two processes. In the first process, the semiconductor integrated circuit 200 generates test patterns. In the second process, a Hi-Z expected value of the tri-state buffer 107 is masked. In a semiconductor integrated circuit which requires a test using a high-rate clock generation circuit such as a PLL circuit, in the first process, waiting is necessary until stable oscillation occurs to generate a high-rate clock. It is therefore necessary to add patterns for necessary steps. In contrast, according to the technique of this embodiment, a self-test by the BIST circuit 103 is not started until stable oscillation of the PLL circuit 203. Test patterns can thus be generated easily.

Although the invention has been illustrated and described for the particular preferred embodiments, it is apparent to a person skilled in the art that various changes and modifications can be made on the basis of the teachings of the invention. It is apparent that such changes and modifications are within the spirit, scope, and intention of the invention as defined by the appended claims.

The present application is based on Japan Patent Application No. 2006-116792 filed on Apr. 20, 2006, the contents of which are incorporated herein for reference.

What is claimed is:

1. A semiconductor integrated circuit, comprising:
a first external terminal which inputs a test signal;
a second external terminal which inputs a clock signal;
a self-test circuit which conducts a self-test based on the clock signal which is input through the second external terminal;
a third external terminal which outputs, to the outside, a test judgment signal which is output from the self-test circuit;
an external output control circuit which controls output of the test judgment signal from the third external terminal on the basis of the test signal which is input through the first external terminal and a test completion signal which is output from the self-test circuit; and
a clock signal input control circuit which controls input, to the self-test circuit, of the clock signal which is input through the second external terminal, on the basis of the test judgment signal and the test completion signal.

2. The semiconductor integrated circuit according to claim 1, wherein the external output control circuit includes:
an external terminal control circuit which outputs an enable signal in accordance with the test signal and the test completion signal; and
a tri-state buffer which controls output, from the third external terminal, of the test judgment signal in accordance with a state of the enable signal which is output from the external terminal control circuit.

3. The semiconductor integrated circuit according to claim 2, wherein the tri-state buffer is rendered in a high-impedance state when the enable signal is in an inactive state.

4. The semiconductor integrated circuit according to claim 2, wherein the tri-state buffer allows the test judgment signal to be output from the third external terminal to the outside when the enable signal is in an active state.

5. The semiconductor integrated circuit according to claim 1, wherein the clock signal input control circuit inputs the clock signal to the self-test circuit when both of the test judgment signal and the test completion signal are normal.

6. The semiconductor integrated circuit according to claim 1, wherein the clock signal input control circuit includes:
a control signal output circuit which outputs a control signal in accordance with the test judgment signal and the test completion signal; and
a PLL circuit which outputs a frequency-divided clock signal which is generated by frequency-dividing the clock signal which is input through the second external terminal, when receiving the control signal from the control signal output circuit; and
wherein the frequency-divided clock signal which is output from PLL circuit is input to the self-test circuit.

\* \* \* \* \*